United States Patent [19]
Leveque et al.

[11] Patent Number: 5,890,282
[45] Date of Patent: Apr. 6, 1999

[54] MAKING AN INTEGRATED CONTROL AND PANEL ASSEMBLY

[76] Inventors: Denis J. Leveque, 9612 W. Vern Ave., Milwaukee, Wis. 53224, .; James R. Jaeschke, 2314 Misty Ln., Waukesha, Wis. 53186

[21] Appl. No.: 695,487

[22] Filed: Aug. 12, 1996

[51] Int. Cl.⁶ ................................................. H05K 3/30
[52] U.S. Cl. ........................... 29/832; 361/627; 361/637; 361/639; 361/641
[58] Field of Search .................................. 361/627, 637, 361/639, 641, 644, 648, 736, 752; 29/825, 832

[56] References Cited

U.S. PATENT DOCUMENTS

| | | | |
|---|---|---|---|
| 4,316,320 | 2/1982 | Nogawa et al. | 29/832 X |
| 4,343,083 | 8/1982 | Takemura et al. | 29/832 |
| 4,675,989 | 6/1987 | Galloway et al. | 29/832 X |
| 5,323,532 | 6/1994 | Schmidt et al. | 29/832 |

*Primary Examiner*—Carl J. Arbes
*Attorney, Agent, or Firm*—Terrence Martin; Jules J. Morris; Sean D. Detweiler

[57] ABSTRACT

A control and panel assembly using a thin dielectric carrier strip upon which a sheet of conductive material is adhesively attached. The conductive sheet is perforated to form an array of spaced parallel discrete conductors. The conductors are initially formed as interconnected by transverse webs which are frangibly removed after attachment to the carrier. Individual stand up connectors are then attached to each of the conductors to form a carrier sub-assembly and the terminals are inserted through slots in a dielectric deck plate. Individual user actuated control components are then plugged directly into the terminals with user actuated shafts or levers extending through deck plate and carrier strip.

11 Claims, 3 Drawing Sheets

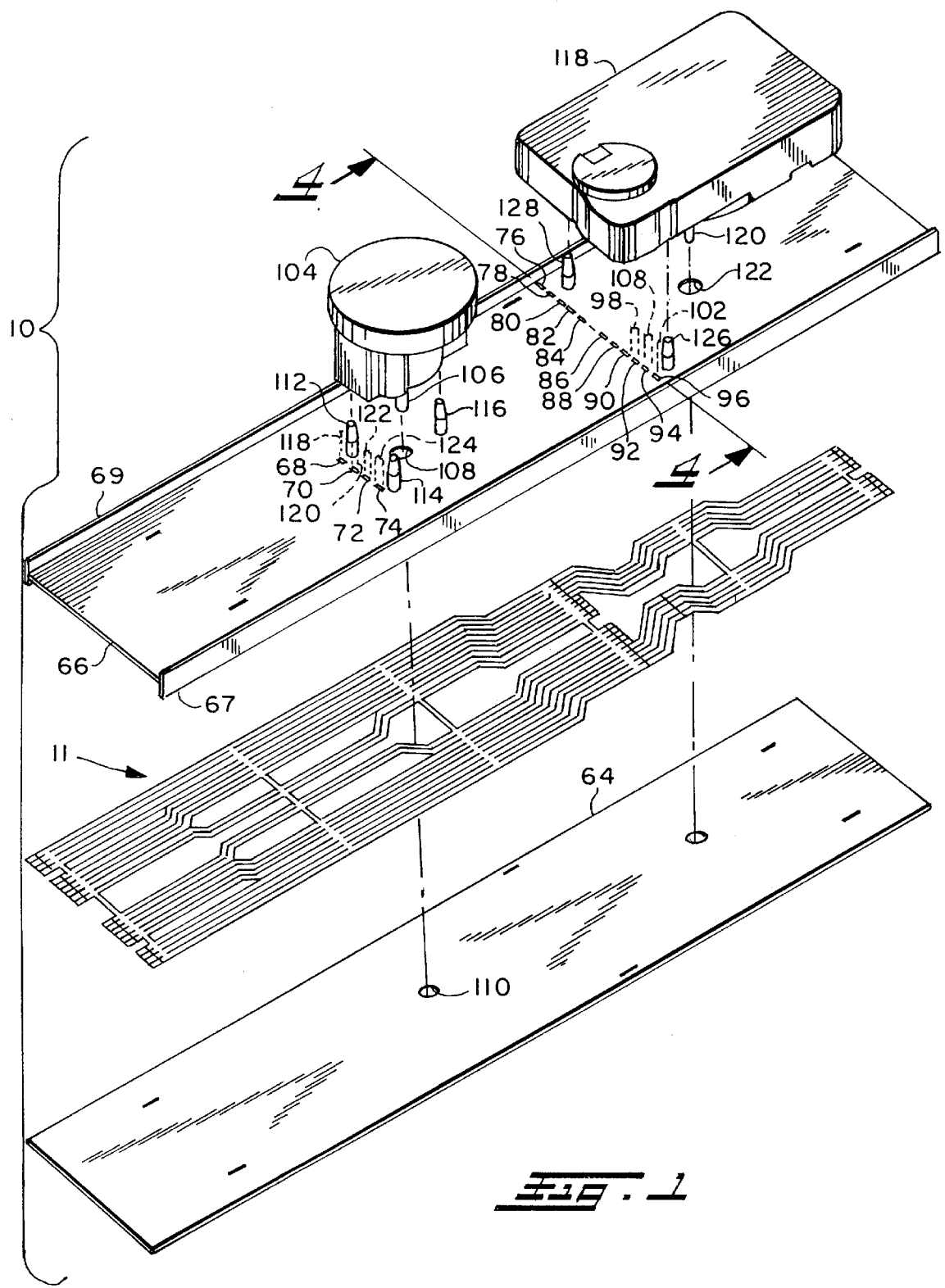

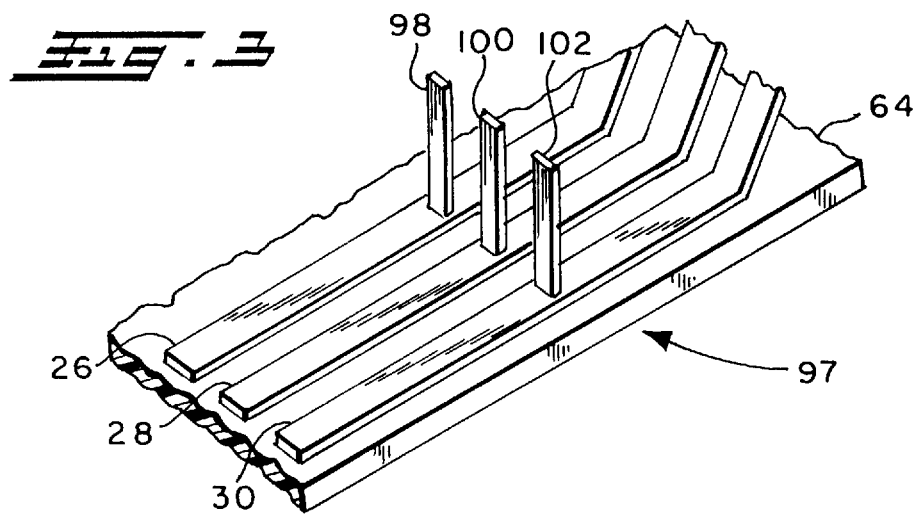
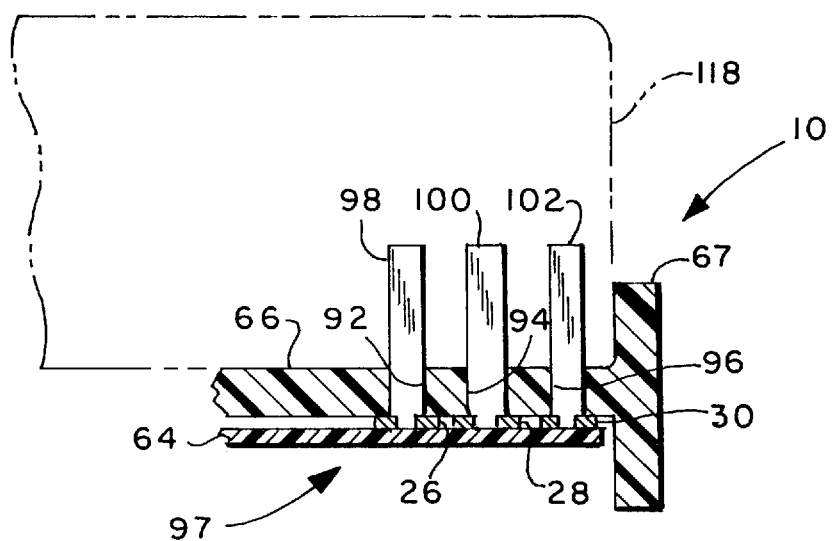

MAKING AN INTEGRATED CONTROL AND PANEL ASSEMBLY

BACKGROUND OF THE INVENTION

The present invention relates to control panels having integrally associated therewith a control device and particularly a device for electrically controlling the operation of remotely located servo actuators for performing an appliance control function. Such panel assemblies are utilized in household appliances such as clothes washing machines, clothes driers and dishwashers. Heretofore, the user control panel for such appliances has utilized discrete control devices such as programmer/timers, pressure switches electrically operated water valve, and other control devices attached to a control panel which is in turn attached to the cabinet or housing for the appliance and more commonly on a control console. The control devices typically have a user operated control shaft with a knob or lever or similar actuator extending through an aperture in the control panel so as to be accessible to the user from the exterior of the control console. The particular control devices mounted on the panel are discretely wired to the servo actuators by individual conductors through a wiring harness which typically extends from the interior of the control console into the main cabinet or housing for the appliance.

The aforesaid arrangement of mounting discrete control devices on a panel requires an attachment of control position indicia on the exterior face of the control panel for user identification of the position of the control device actuator. Typically indicia are provided by decals, stickers or a separate metal foil panel strip provided over the exterior face of the control panel. This arrangement has proven to be costly in mass production of household appliances in terms of complexity and the time required for assembly of the plurality of individual electrical wire leads and connectors required for hookup of the control devices to the appliance wiring harness.

It has thus been desired to provide a way or means of assembling control devices to a control panel for an electrically operated appliance which is relatively low in manufacturing cost and is simple to assemble during manufacture of the appliance and is reliable in service.

SUMMARY OF THE INVENTION

It is an object of the present invention to provide a simple, easy to assemble and relatively low-cost control panel for an electrically operated appliance with the control panel having user actuated electrical control devices thereon for effecting and controlling various appliance functions during the operating cycle of the appliance.

It is a further object of the present invention to provide an integrated control and panel assembly having electrical conductors integrally assembled therewith and with the control devices directly plugged into the conductors from the back of the control panel.

It is another object of the invention to provide an integrated control and panel assembly with the indicia for control actuator position preassembled with the conductors on the panel thereby eliminating the need for separate attachment of indicia on the front face of the control panel.

The present invention utilizes a plastic control panel deck having a plurality of conductors interconnected by frangible webs stamped from a single sheet or strip of electrically conductive material. The stamped sheet is attached to a thin flexible dielectric strip and the webs are punched out to provide discrete electrically isolated conductors on the carrier sheet. The conductor strips are then provided with stand up terminals thereon which are inserted through the deck en masse; and, the control devices are directly connected to the terminals by a plug in connection. The flexible carrier strip and electrical conductors are thus on the outside face of the control panel deck from the control devices with the carrier strip serving to electrically insulate the conductors and to provide, if desired, the face of the control panel with control device actuator position indicia provided thereon. However, it will be understood that, if desired, an additional panel may be provided over the carrier strip or, in other words, the assembly of the present invention may be inserted from the back side of an existing control console panel having the control actuator position indicia provided on the exterior thereof.

BRIEF DESCRIPTION OF THE DRAWINGS

FIG. 1 is an axonometric exploded view of the assembly of the present invention;

FIG. 2a is a plan view of the layout of the conductor sheet before assembly;

FIG. 2b is an enlarged view of a portion of FIG. 2a;

FIG. 3 is an axonometric view of a portion of the carrier strip sub-assembly with conductors and terminals attached;

FIG. 4 is a section view taken along section indicating lines 4—4 in FIG. 1.

DETAILED DESCRIPTION

Figures 2A, 2B:
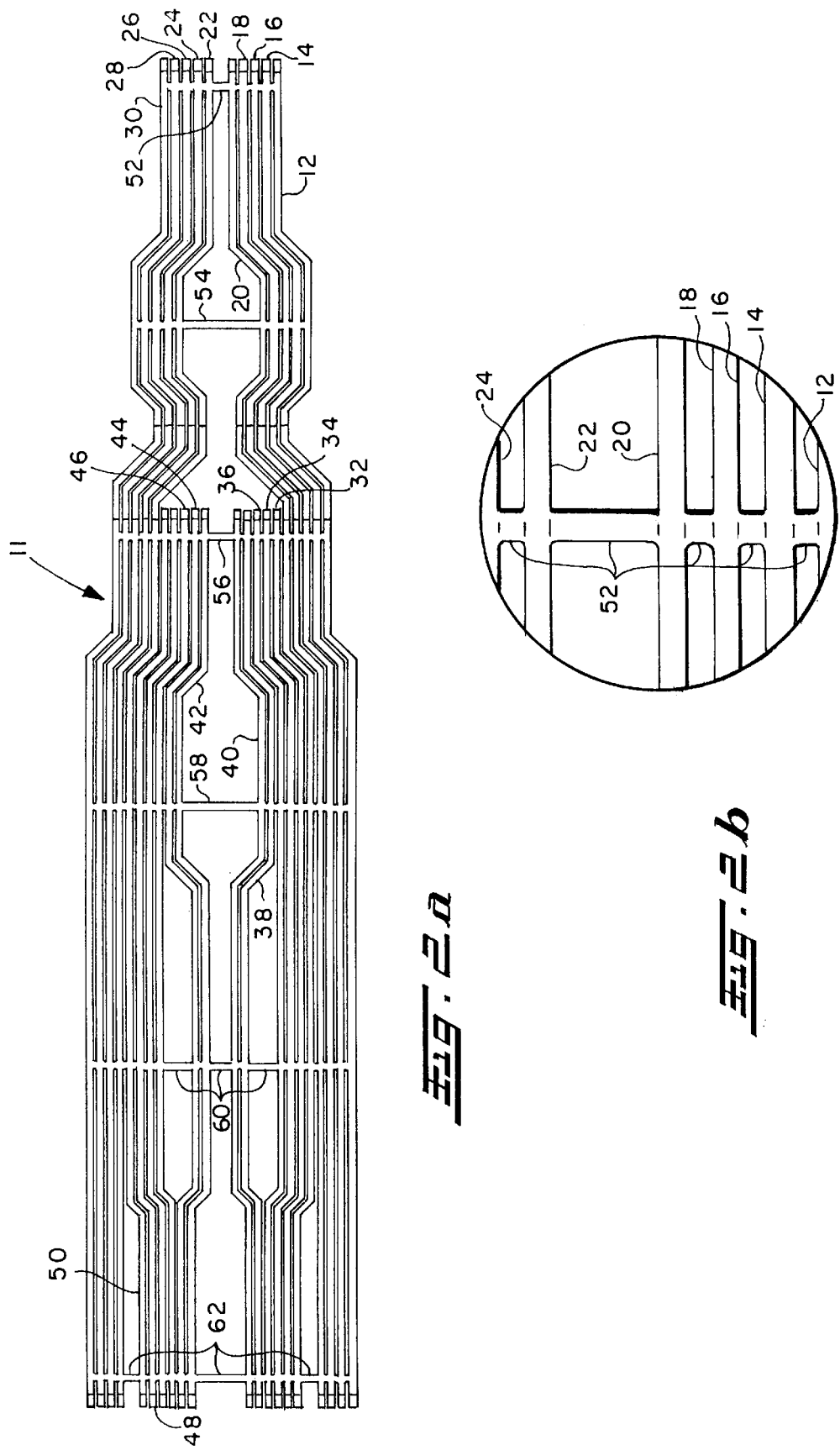

Referring to FIGS. 1, 2a and 2b, the assembly of the present invention is indicated generally at 10 and includes a conductor sheet or strip indicated generally at 11 which is formed by stamping or perforating an elongated relatively thin strip of conductive material comprising individual or discrete conductor strips 12 through 50 which are interconnected by transverse webs 52 through 62 spaced preferably in a generally parallel planar array. The stamped array of conductors as shown on FIG. 2 is attached adhesively to a relatively thin flexible dielectric sheet or strip 64; and, the transverse webs 52 through 62 are then frangibly removed by any convenient expedient as, for example, punching or stamping leaving the individual discrete conductive strips electrically isolated from each other. The portions to be removed are indicated by dashed line in FIGS. 2a and 2b and include the portions between each of the strips 12 through 50 and which are aligned in a direction transversely of the strip with the portions denoted by reference numerals 52 through 62. FIG. 2b shows the portions of strip 52 not identified by reference numerals in FIG. 2a; and, it will be understood that the arrangement of FIG. 2b is typical of webs 54, 56, 58, 60, 62.

In the presently preferred practice of the invention, the conductor sheet 11 is formed of copper or brass material having a thickness of 0.006 to 0.010 inches (0.15–0.25 millimeters). The width of each of the individual conductors 12 through 50 is about 0.150 inches (3.8 millimeters) for a current carrying capacity of 50 amperes. It will be understood however that the thickness and width of the conductors 12 through 50 may be varied to accommodate different current carrying requirements.

The strip 12 is attached adhesively to the carrier strip 64 which is, in the present practice of the invention, formed of dielectric material having a thickness in the range 0.020–0.030 inches (0.5–0.76 millimeters); and, it has been found satisfactory to form the carrier of acrylic plastic material however other suitable dielectric materials may be used. As described above, the transverse webs 52 through 62 interconnecting the individual conductors of strip 12 are punched out after the strip 12 is adhesively secured to the carrier 64.

Referring to FIGS. 1 and 4, a dielectric deck plate or mounting panel 66 is provided and is illustrated as having a generally thin flat plate or strip configuration with flanges along the elongated edges thereof for stiffening; and, in the present practice of the invention the deck panel is formed of thermoset plastic material, as for example styrene material and has a thickness of about 0.080 inches (2.0 millimeters). It will be understood however that other suitable dielectric materials may be employed and other dimensions used. The deck plate has a plurality of slots denoted by reference numerals 68 through 96 provided therethrough for receiving electrical terminal connectors as will hereinafter be described.

Referring to FIGS. 3 and 4, the conductive strips on the carrier 64 each have an electrical stand up terminal attached thereto at locations thereon to correspond with one of the slots 68 through 96. Three of the conductive strips 26, 28, 30 are illustrated typically in FIGS. 3 and 4 as having respectively a stand up connector terminal denoted by reference numerals 98, 100, 102 having one end attached thereto. As shown in FIG. 4, the attached end of the terminal connectors 98, 100, 102 has a portion thereof received in a slot or aperture provided in the conductor strip 26, 28, 30. In the present practice of the invention the terminal strips 98, 100, 102 are attached mechanically to the conductors 26, 28, 30 by any suitable expedient, as for example, resistance welding, twist locking, sonic welding, soldering or press fitting and form with the conductors 12 through 50 a carrier sub-assembly indicated generally at 99 in FIGS. 3 and 4. It will be understood that the terminals such as 98, 100, 102 have been omitted from strip 11 in FIG. 1 for simplicity of illustration.

Referring to FIGS. 1 and 4, the sub-assembly 97 comprising carrier 64 with the conductor strips formed discretely thereon (e.g., with the transverse webs 52 through 62 removed) and with the stand up terminal such as 98, 100, 102 attached thereto is assembled to the underside of deck plate 66 with the stand up terminals extending through one of the slots 68 through 96. Stand up terminal 98 is received through slot 92, stand up terminal 100 is received through slot 94 and stand up terminal 102 is received through slot 96 with the stand up terminals extending upwardly beyond the upper surface of the deck plate 66. Terminals 98, 100, 102 and others are shown in the assembled condition in dashed outline in FIG. 1. It will be understood the terminals 98, 100, 102 are illustrated as typical of the terminal connection to each of the strips 12 through 50, the remaining terminals having been omitted for simplicity of illustration.

Referring to FIG. 1, assembly 10 includes at least one control device such as the pressure switch 104 having a control shaft 106 extending downwardly therefrom which is received through an aperture 108 formed in the deck plate and through a correspondingly located aperture 110 formed in the carrier 64 for user access thereto. Typically, shaft 106 will have a control knob (not shown) attached to the end thereof after assembly into the appliance to be controlled.

Pressure switch 104 engages mounting or guide pins 112, 114, 116 attached to the deck plate for locating and retaining the pressure switch. The pressure switch is electrically connected by stand up terminals 118 through 124 (shown in dashed outline) from the conductors 38, 40, 42, 44 which terminals are similar to the terminals 98, 100, 102 illustrated in FIGS. 3 and 4.

A second control device such as for example, the programmer timer 118, with a user actuated control shaft 120 extending downwardly therefrom through an aperture 122 formed in deck plate 66, is assembled onto the upper surface of the deck plate 66 and guided and located thereon by a pair of pins 124, 126. The programmer timer 118 has electrical connector receptacles formed therein (not shown) each of which connects with one of the stand up terminals 98, 100, 102 for electrical connection thereto and is positioned as shown in dashed outline in FIG. 4.

The completed assembly 10 with the control devices 104, 118 attached to the deck 66 thus has the control devices electrically connected to the conductor strips 12–50 which are adhesively attached to the carrier 64 and positioned on the opposite side of the deck 66 from the control devices 104, 118. The completed assembly may then be attached to the console of an appliance to be controlled with the control shafts 106, 120 extending outwardly therefrom. If desired the assembly 10 may be attached to a control console opening such that the undersurface of carrier 64 becomes the actual face of the control panel. In such an arrangement, individual indicia of the rotary position of shafts 106, 120 may be provided directly on the undersurface of carrier 64 by any suitable expedient such as stickers, embossing, paint or decals. Alternatively the assembly 10 may be mounted behind a panel such that the undersurface of carrier 64 contacts the back surface of the panel. The present invention thus provides a unique and relatively low cost way of fabricating a control panel having the control devices mounted thereon and electrically connected thereto without the need for individual wire leads or wiring harness connectors.

Although the present invention has been described above with respect to the illustrated embodiments, it will be understood that the invention is capable of modification and variation and is limited only by the following claims.

We claim:

1. A method of making an integrated control and panel assembly comprising:

(a) perforating a relatively thin strip of conductive material and forming a plurality of discrete conductors interconnected by webs;

(b) attaching said strip to a relatively thin flexible dielectric carrier sheet;

(c) removing said webs and electrically isolating said conductors;

(d) attaching a stand up connector to at least two of said isolated conductors;

(e) forming a dielectric deck plate having cutouts therein and inserting each of said stand up connectors through one of said perforations and disposing said conductors in contact with said deck plate; and, (f) directly connecting a control device to said connectors and attaching said control device to said deck plate.

2. The method defined in claim 1, wherein said step of attaching said control device includes forming an attachment stanchion on said deck.

3. The method defined in claim 1, wherein said step of attaching at least one control device includes inserting a user operated control shaft through said deck.

4. The method defined in claim 1, wherein said step of forming a plurality of discrete conductors includes forming said conductors in a spaced generally parallel array.

5. The method defined in claim 1, wherein said step of attaching a stand up connector is selected from the group consisting of twist docking, resistance welding, sonic welding, soldering and press fitting.

6. The method defined in claim 1, wherein said step of forming a deck plate includes molding thermoset plastic material.

7. The method defined in claim 1, wherein said step of forming perforations in said deck plate includes molding.

8. The method defined in claim 1, wherein said step of removing said webs includes frangibly removing.

9. The method defined in claim 1, wherein said step of attaching said unitary strip to said dielectric sheet includes adhesively bonding.

10. The method defined in claim 1, wherein said step of directly connecting includes plugin connecting to said stand up connectors.

11. The method defined in claim 1, wherein said forming a deck plate includes extending.

* * * * *